United States Patent
Lin et al.

(10) Patent No.: US 7,683,487 B2
(45) Date of Patent: Mar. 23, 2010

(54) STRUCTURE APPLIED TO A PHOTOLITHOGRAPHIC PROCESS

(75) Inventors: Shun-Li Lin, Hsinchu (TW); Yun-Chu Lin, Hsinchu (TW); Wen-Chung Chang, Hsinchu (TW); Ching-Yi Lee, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 537 days.

(21) Appl. No.: 11/307,006

(22) Filed: Jan. 19, 2006

(65) Prior Publication Data

US 2006/0199375 A1    Sep. 7, 2006

Related U.S. Application Data

(62) Division of application No. 10/707,632, filed on Dec. 26, 2003, now Pat. No. 7,008,870.

(51) Int. Cl.
*H01L 23/48* (2006.01)

(52) U.S. Cl. .............. 257/758; 257/763; 257/E21.029; 430/311

(58) Field of Classification Search ............ 438/636; 257/437, 758, 763, 770, E21.029; 430/312, 430/311, 317

See application file for complete search history.

(56) References Cited

U.S. PATENT DOCUMENTS

| 6,194,308 | B1 * | 2/2001 | McTeer et al. | 438/627 |
| 7,163,879 | B2 * | 1/2007 | Tamura | 438/585 |
| 2004/0198030 | A1 * | 10/2004 | Buehrer et al. | 438/585 |

OTHER PUBLICATIONS

Moskovits et al., "Application of classical oscillator functions to the simultaneous determination of substrate optical constants and film thickness from ellipsometric measurement" Journal of Chemical Society, Faraday Transaction 2: Moleculaar and Chemical Physics (1975) 71(2) 387-92.*

* cited by examiner

*Primary Examiner*—Thanhha Pham
(74) *Attorney, Agent, or Firm*—Jianq Chyun IP Office

(57) ABSTRACT

A structure applied to a photolithographic process is provided. The structure includes at least a film layer, an optical isolation layer, an anti-reflection coating and a photoresist layer sequentially formed over a substrate. In the photolithographic process, the optical isolation layer stops light from penetrating down to the film layer. Since the optical isolation layer is set up underneath the photoresist layer, light emitted from a light source during photo-exposure is prevented from reflecting from the substrate surface after passing through the film layer. Thus, the critical dimensions of the photolithographic process are unaffected by any change in the thickness of the film layer.

4 Claims, 3 Drawing Sheets

STRUCTURE APPLIED TO A PHOTOLITHOGRAPHIC PROCESS

CROSS-REFERENCE TO RELATED APPLICATION

This is a divisional application of application Ser. No. 10/707,632, filed on Dec. 26, 2003, which is now allowed and all disclosures of the application are incorporated herewith by reference.

BACKGROUND OF THE INVENTION

1. Field of the Invention

The present invention relates to a structure applied to a photolithographic process. More particularly, the present invention relates to a structure applied to a photolithographic process for improving critical dimensions uniformity.

2. Description of the Related Art

In the fabrication of a semiconductor device, a number of photolithographic processes needs to be carried out. Since each photolithographic process is going to affect the final quality of the semiconductor device, photolithography is a very important process. For example, accuracy of the photolithographic process is a major factor that determines the highest possible circuit density and the ultimate reliability of an integrated circuit. Furthermore, the photolithographic process affects the positioning and uniformity of metallic interconnects and via plugs connection with transistor significantly.

However, in a conventional photolithographic process, the photoresist layer can hardly absorb all light emitted from the photo-exposure light source. Consequently, a portion of the incoming light will penetrate through the photoresist layer and reflect from the substrate. The incoming light may interfere constructive or destructively with the reflected light to produce standing waves. Under such circumstances, the profile of the photoresist layer after photoresist patterning will be fuzzy.

To resolve the back reflection problem, an anti-reflection coating is formed underneath the photoresist layer (that is, form an anti-reflection layer between the photoresist layer and an underlying film layer) to absorb the light that penetrates through the photoresist layer during a photo-exposure. In the presence of the anti-reflection coating, interference between incoming and reflected light is minimized. In general, the anti-reflection coating is fabricated using a dielectric material such as silicon nitride, silicon oxynitride or an organic material with high light absorption properties.

However, the light absorption coefficients of all these materials are often insufficiently high to absorb most of the incoming light. In other words, a portion of the incoming light still penetrates through the anti-reflection coating and underlying film layers and gets reflected by the substrate surface to interfere with the incoming light. Moreover, the critical dimensions of a photoresist pattern are often affected by any varying of thickness in the film layer underneath the anti-reflection coating. Ultimately, critical dimensions of the photoresist pattern will not be uniform.

SUMMARY OF THE INVENTION

Accordingly, at least one objective of the present invention is to provide structure applied to a photolithographic process for stopping light emitted from a light source during a photo-exposure from penetrating through a film layer to reach a substrate surface. Hence, variation in the thickness of the film layer has very little effect on the critical dimensions of the photolithographic process.

At least a second objective of this invention is to provide a method of fabricating a semiconductor device that deploys the aforementioned photolithographic processing structure so that the device can have highly uniform critical dimensions.

To achieve these and other advantages and in accordance with the purpose of the invention, as embodied and broadly described herein, the invention provides a structure applied to a photolithographic process. The structure comprises a substrate having at least a film layer thereon. Furthermore, an optical isolation layer, an anti-reflection coating and a photoresist layer are set up over the substrate sequentially. The optical isolation layer stops incoming light from penetrating through the layer. In one embodiment, the optical isolation layer has a light absorbing coefficient larger than 1.8. Hence, the amount of light that can reach the surface of the substrate during a photo-exposure process is greatly reduced.

This invention also provides a method of fabricating a semiconductor device. First, a substrate is provided. Thereafter, at least a film layer, an optical isolation layer, an anti-reflection coating and a photoresist layer are sequentially formed over the substrate. A photolithographic process is carried out to pattern the photoresist layer so that a portion of the anti-reflecting coating is exposed. Using the patterned photoresist layer as a mask, the anti-reflection coating and the optical isolation layer are patterned and openings are formed in the film layer above the substrate.

This invention also provides an alternative method of fabricating a semiconductor device. First, a substrate having at least a film layer, an optical isolation layer, an anti-reflection coating and a photoresist layer already sequentially formed thereon is provided. Thereafter, a photolithographic process is carried out to pattern the photoresist layer so that a portion of the anti-reflection coating is exposed. Using the patterned photoresist layer as a mask, the anti-reflection coating and the optical isolation layer are patterned. The patterned photoresist layer and the patterned anti-reflection coating are removed. Finally, using the optical isolation layer as a mask, an etching operation is carried out to form openings in the film layer.

In the aforementioned photolithographic processing structure, an optical isolation layer is set up underneath the photoresist layer. Hence, during photo-exposure, light from a light source can hardly penetrate through the film layer to get a back reflection from the substrate surface. In other words, thickness of the film layer underneath the photoresist layer has very little effect on the critical dimensions of the photolithographic process.

In addition, critical dimensions of the semiconductor device in subsequent fabrication process will improve due to a better control of the critical dimensions during the photolithographic process. Furthermore, the optical isolation layer in the aforementioned structure may serve as an etching stop layer or a polishing stop layer as well.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1A:
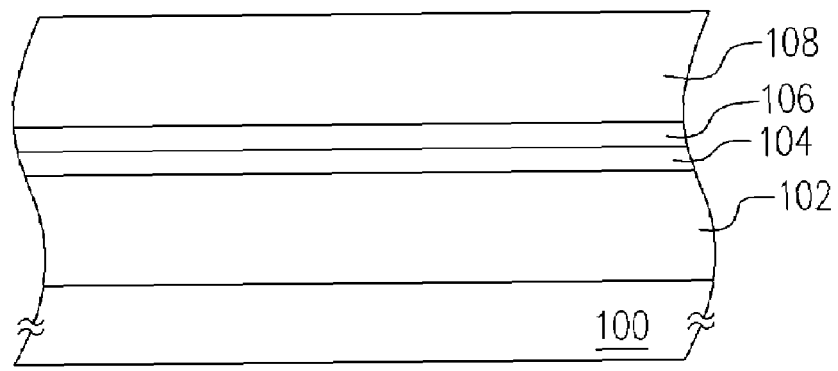
FIGS. 1A through 1E are schematic cross-sectional views showing the progression of steps for forming the contacts of metallic interconnects according to a first preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

In the following description, the process of fabricating the contacts of metallic interconnects is used as an example to show how the structure of this invention can be applied to a photolithographic process.

FIGS. 1A through 1E are schematic cross-sectional views showing the progression of steps for forming the contacts of metallic interconnects according to a first preferred embodiment of this invention. As shown in FIG. 1A, a dielectric layer 102, an optical isolation layer 104, an anti-reflection coating 106 and a photoresist layer 108 are sequentially formed over a substrate 100. The dielectric layer 102 serves as an interlayer dielectric layer for the metallic interconnects and covers a plurality of semiconductor devices (not shown) and other film layers (not shown) already formed on the substrate 100.

The optical isolation layer 104 preferably has a light absorbing coefficient greater than 1.8. Furthermore, the optical isolation layer 104 is fabricated using a metallic material or a conductive material including polysilicon, tungsten or aluminum, for example. The anti-reflection coating 106 is fabricated using an inorganic material such as silicon nitride or silicon oxynitride or an organic material suitable for anti-reflection.

Figure 1B:
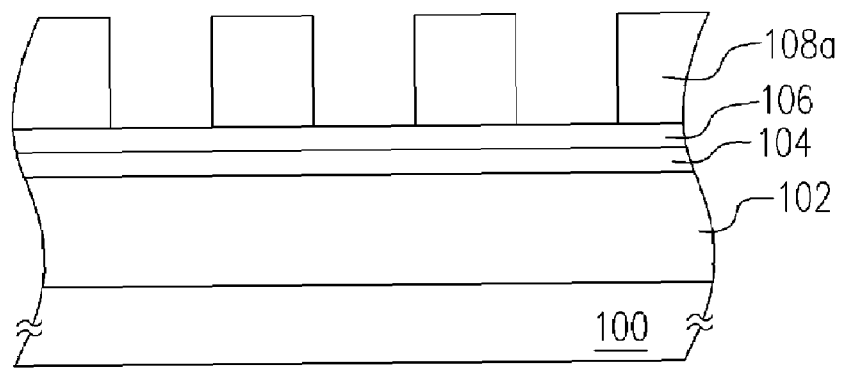

As shown in FIG. 1B, a photolithographic process is carried out to pattern the photoresist layer 108 into a patterned photoresist layer 108a so that a portion of the anti-reflection coating 106 is exposed.

Note that the anti-reflecting coating 106 is able to absorb some of the light passing through the photoresist layer 108 during the photo-exposure in the photolithographic process. Any residual light not absorbed by the anti-reflection coating 106 is completely blocked by the optical isolation layer 104. The optical isolation layer 104 has a high light absorption coefficient so that most of the light passing through the anti-reflection coating 106 is absorbed. Furthermore, the optical isolation layer 104 reflects a portion of the light back onto the anti-reflection coating 106 so that the anti-reflection coating 106 can reabsorb the light. As a result, the optical isolation layer 104 is able to block any light heading towards the underlying dielectric layer 102. Consequently, any variation in thickness of the dielectric layer 102 underneath the photoresist layer 108 has little effect on the critical dimensions of the photolithographic process. That means, the critical dimensions produced after the photolithographic process is highly uniform.

Aside from blocking the passage of light, the optical isolation layer 104 may serve as an etching stop layer or a polishing stop layer in a subsequent process. Details of its application are explained below.

Figure 1C:
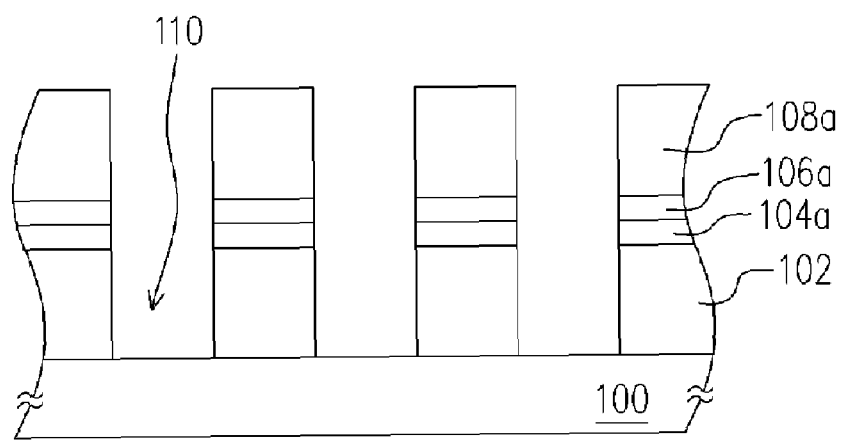

As shown in FIG. 1C, an etching process is carried out using the patterned photoresist layer 108a as a mask to form a patterned anti-reflection coating 106a, an optical isolation layer 104a and a plurality of contact openings 110 in the dielectric layer 102.

Note that a definite thickness of the patterned photoresist layer 108a, the anti-reflection coating 106a or the entire patterned photoresist layer 108a and the anti-reflection coating 106a may be etched away after the etching operation. However, because the optical isolation layer 104 is fabricated using a metallic or polysilicon material in this invention, the dielectric layer has an etching rate much higher than the optical isolation layer 104. Even though the patterned photoresist layer 108a and the patterned anti-reflection coating 106a are completely etched away, the optical isolation layer 104a can still serve as an etching mask to complete the patterning process and form the contact openings 110 in the dielectric layer 102.

Figure 1D:
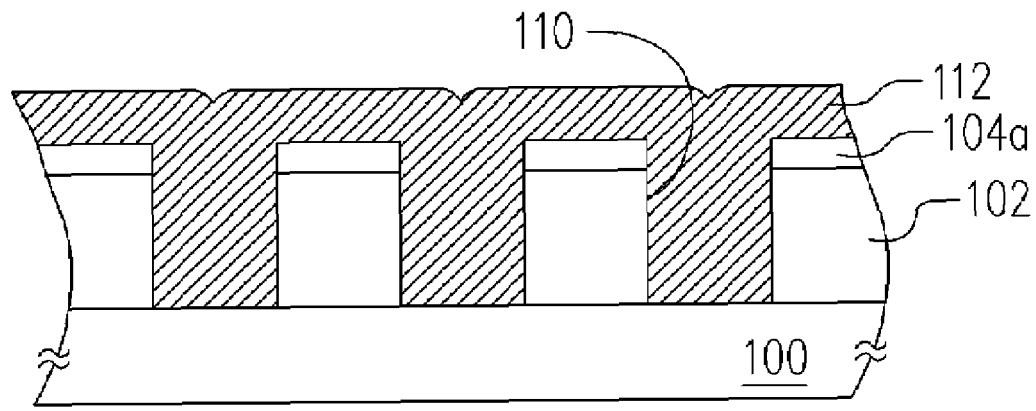

As shown in FIG. 1D, the patterned photoresist layer 108a and the patterned anti-reflection coating 106a are removed. If the patterned anti-reflection coating 106a is fabricated using organic material, the patterned anti-reflection coating 106a and the photoresist layer 108a can be removed together in the same process. However, if the patterned anti-reflection coating 106a is fabricated using inorganic material such as silicon nitride or silicon oxynitride, a separate etching process must be carried out after removing the photoresist. Thereafter, a material layer 112 is formed over the patterned optical isolation layer 104a so that the contact openings 110 are completely filled. The material layer 112 is fabricated using a metallic material such as tungsten, copper or a conductive material.

Figure 1E:
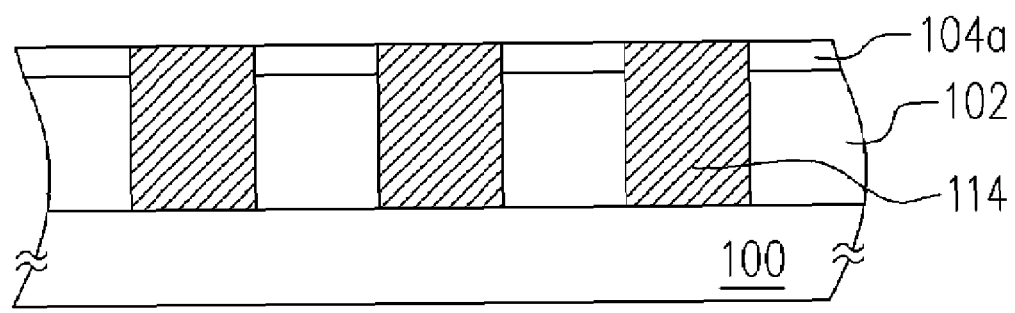

As shown in FIG. 1E, a chemical-mechanical polishing process is carried out to remove the material layer 112 above the patterned optical isolation layer 104a and expose the optical isolation layer 104a. Hence, contacts 114 are formed in the dielectric layer 102. Note that the patterned optical isolation layer 104a can serve as a polishing stop layer in the chemical-mechanical polishing process.

If the contact openings 110 have a high aspect ratio, another series of step may be performed to form the contact openings 110 after patterning the photoresist layer 108a (as shown in FIG. 1B). The method is explained as another embodiment of this invention below.

Figure 2A:
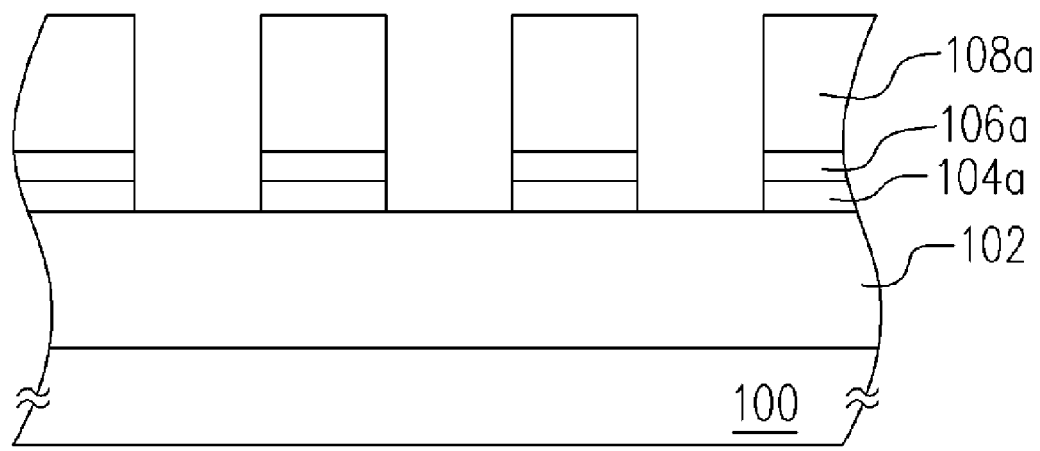
FIGS. 2A and 2B are schematic cross-sectional views showing a portion of the steps for producing the contacts of metallic interconnects according to another preferred embodiment of this invention.
Figure 2B:
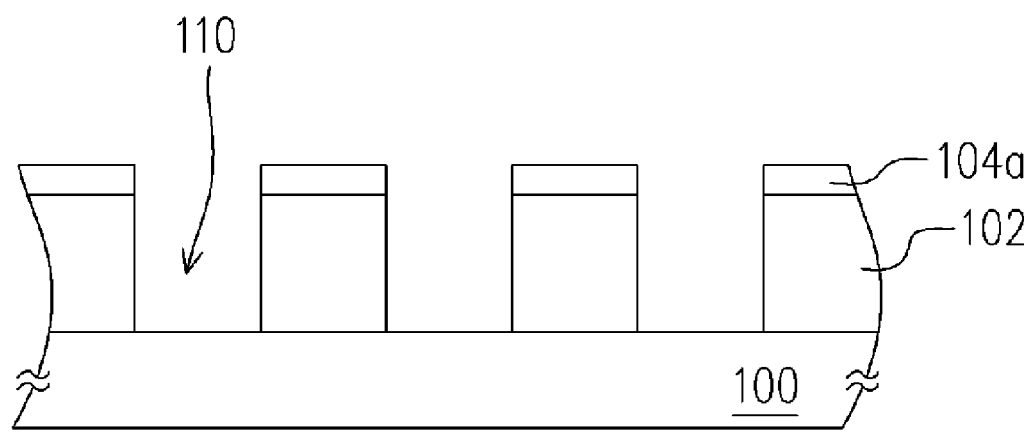

FIGS. 2A and 2B are schematic cross-sectional views showing a portion of the steps for producing the contacts of metallic interconnects according to another preferred embodiment of this invention. As shown in FIG. 2A, after forming the patterned photoresist layer 108a as shown in FIG. 1B, an etching operation is carried out using the patterned photoresist layer 108a as a mask to form a patterned anti-reflection coating 106a and a patterned optical isolation layer 104a.

As shown in FIG. 2B, the patterned photoresist layer 108a and the patterned anti-reflection coating 106a are removed. Thereafter, using the patterned optical isolation layer 104a as a mask, an etching operation is carried out to form contact openings 110 in the dielectric layer 102. Since the patterned photoresist layer 108a and the patterned anti-reflection coating 106a are removed before etching the dielectric layer 102, the aspect ratio of the contact openings 110 is greatly reduced. Hence, the contact openings 110 are easier to form.

After forming the contact openings 110, conductive material is deposited into the contact openings 110 to form the contact as in the first embodiment (refer to FIGS. 1D and 1E).

Since the optical isolation layer effectively stops any light from going to the film layer underneath, any variation of thickness of the film layer underneath the photoresist layer will not affect the critical dimensions of the photolithographic process. Furthermore, the optical isolation layer may serve as a stopping layer in a subsequent chemical-mechanical polishing process or an etching process.

Although the process of fabricating the contacts of metallic interconnects is used in the two aforementioned embodiments, the applications of the photolithographic processing structure according to this invention are not limited as such. In fact, any photolithographic process for fabricating a semiconductor device may utilize the structure to improve the uniformity of critical dimensions.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A structure applied to a photolithographic process, comprising:
   a substrate having at least a dielectric layer thereon;
   an optical isolation layer having a light absorbing coefficient greater than 1.8 comprising polysilicon or tungsten set up over the substrate to directly contact to dielectric layer;
   an anti-reflection coating set up over the optical isolation layer; and
   a photoresist layer set up over the anti-reflection coating.

2. The structure of claim 1, wherein material constituting the anti-reflection coating comprises an organic material.

3. The structure of claim 1, wherein material constituting the anti-reflection coating comprises an inorganic material.

4. The structure of claim 1, wherein the dielectric layer is a target layer to be patterned, and the anti-reflection coating is a removable layer after the dielectric layer is patterned.

* * * * *